United States Patent [19]

Hyatt

[11] 4,144,582

[45] Mar. 13, 1979

[54] VOICE SIGNAL PROCESSING SYSTEM

[76] Inventor: Gilbert P. Hyatt, P.O. Box 4584, Anaheim, Calif. 92803

[21] Appl. No.: 801,879

[22] Filed: May 31, 1977

Related U.S. Application Data

[63] Continuation-in-part of Ser. No. 752,240, Dec. 20, 1976, Ser. No. 325,933, Jan. 22, 1973, Pat. No. 4,016,540, Ser. No. 325,941, Jan. 22, 1973, Pat. No. 4,060,848, Ser. No. 302,771, Nov. 1, 1972, Ser. No. 291,394, Sep. 22, 1972, Ser. No. 288,247, Sep. 11, 1972, Ser. No. 246,867, Apr. 24, 1972, Ser. No. 230,872, Mar. 1, 1972, Ser. No. 232,459, Mar. 7, 1972, Ser. No. 229,213, Apr. 13, 1972, Pat. No. 3,820,894, Ser. No. 135,040, Apr. 19, 1971, Ser. No. 101,881, Dec. 28, 1970, and Ser. No. 134,958, Apr. 19, 1971.

[51] Int. Cl.² ............................................. G06F 3/00
[52] U.S. Cl. ..................................................... 364/900
[58] Field of Search ... 364/200 MS File, 900 MS File, 364/300, 474; 365/1; 179/1 SA, 1 SG, 1 SM

[56] References Cited

U.S. PATENT DOCUMENTS

| | | | |
|---|---|---|---|
| 2,897,638 | 8/1959 | Maker | 364/474 X |
| 3,403,227 | 9/1968 | Malm | 179/1 SA |
| 3,506,975 | 4/1970 | Bobeck et al. | 365/1 |
| 3,584,781 | 6/1971 | Edson | 364/300 |
| 3,584,782 | 6/1971 | Bergland | 364/300 |
| 3,588,353 | 6/1971 | Martin | 179/1 SM |
| 3,828,132 | 8/1974 | Flanagan et al. | 179/1 SA |

OTHER PUBLICATIONS

Bandat, K. & Rothauser, E., "Speech Digitizer and Synthesizer", *IBM T.D.B.*, vol. 7, No. 11, Apr., 1965, pp. 974-975.

Buchholz, W., "Computer Controlled Audio Output", *IBM T.D.B.*, vol. 3, No. 5, Oct., 1960, p. 60.

*Primary Examiner*—Raulfe B. Zache
*Attorney, Agent, or Firm*—Gilbert P. Hyatt

[57] ABSTRACT

A system is provided for voice signal processing including recognizing input voice messages and generating output voice messages. Digital processing of voice signals yields particular advantages. Voice responsive operations provide operator interaction flexibility. Communication of digital information in response to voice information provides data compression for communication applications. Other applications of the voice signal processing system include an audionic clock, an audionic calculator, and an audionic announciator.

25 Claims, 12 Drawing Figures

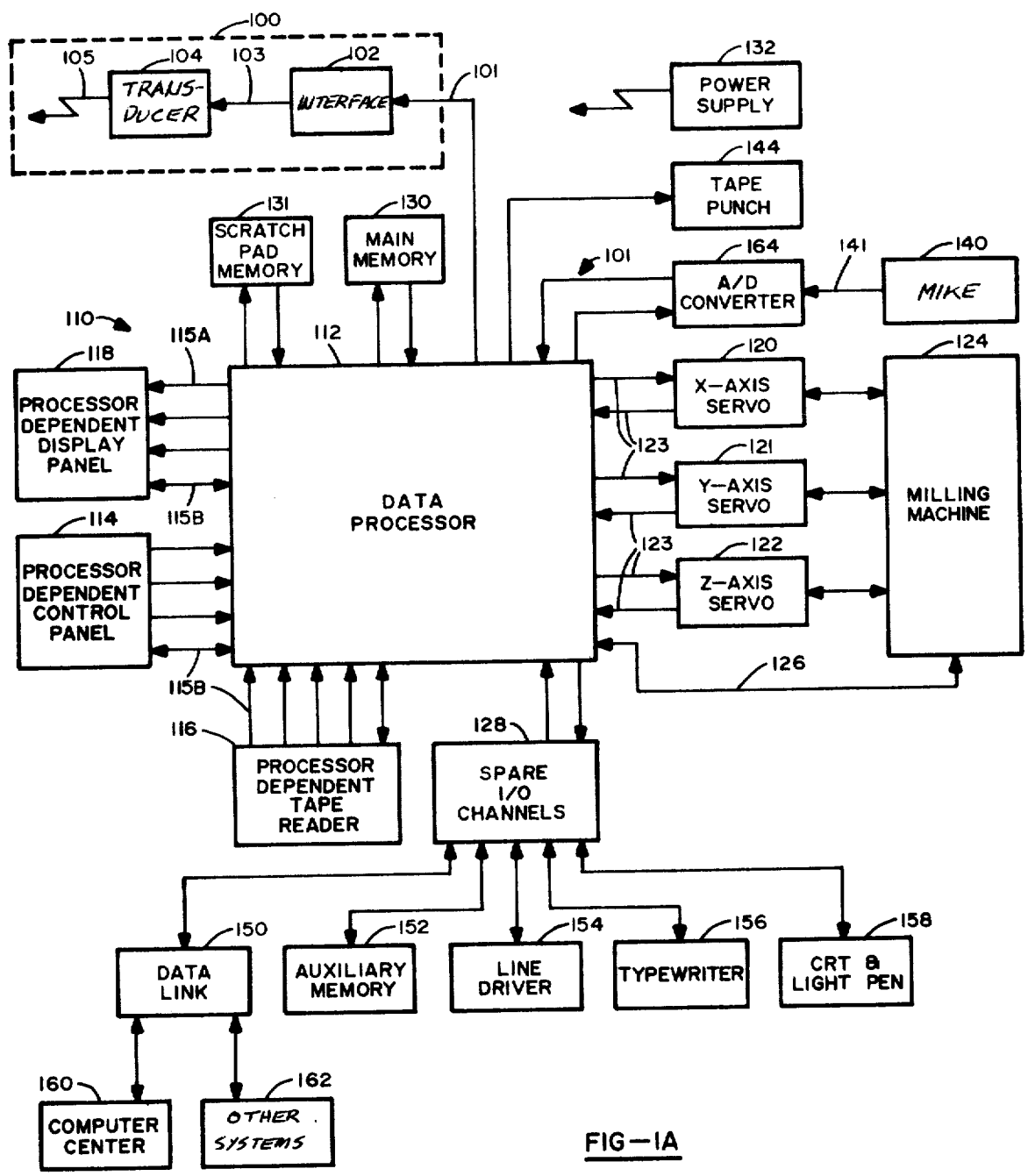
FIG—1A
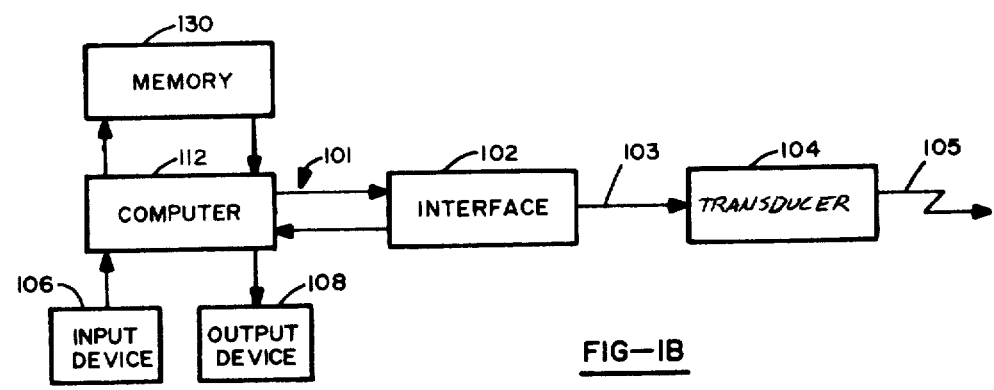
FIG—1B

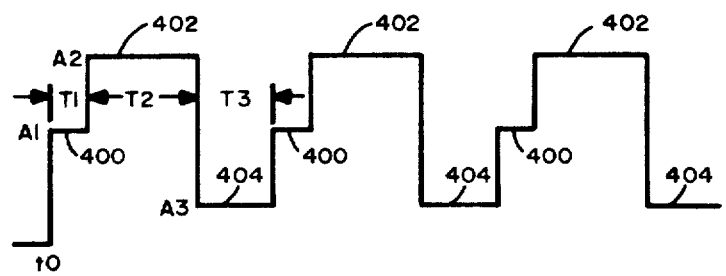
FIG—4A
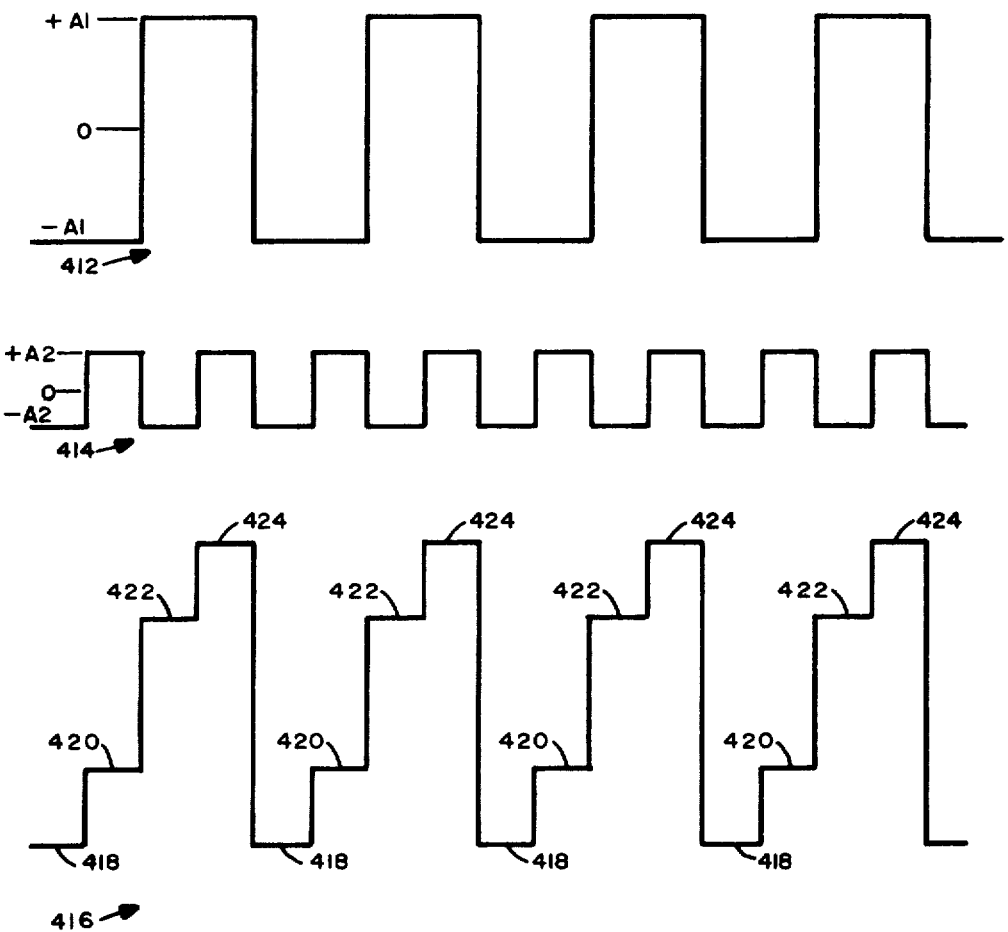
FIG—4B

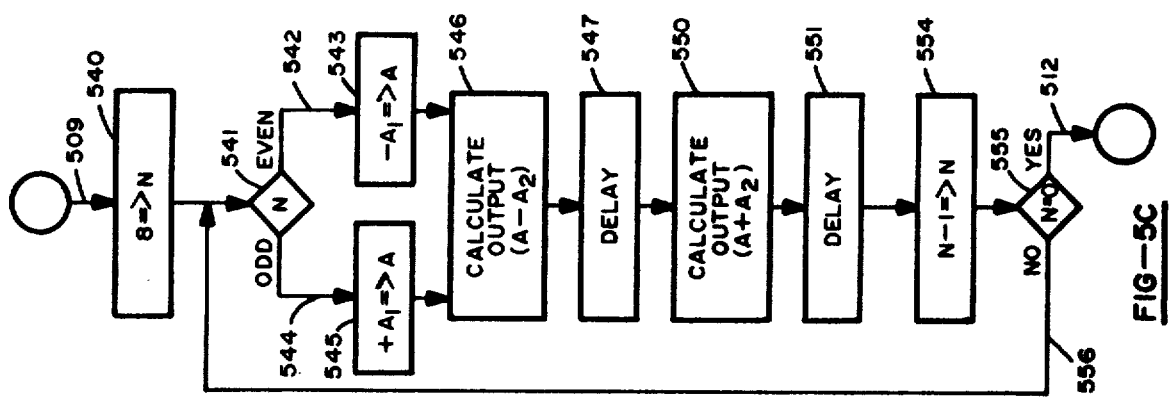
FIG—5C
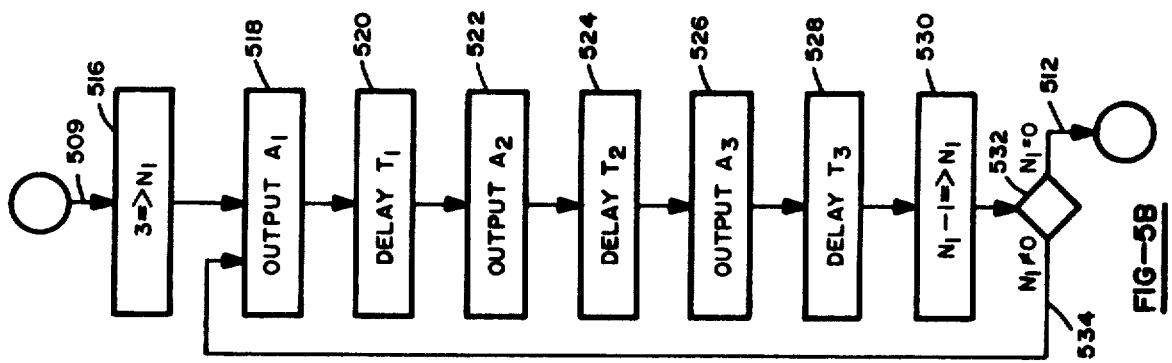
FIG—5B
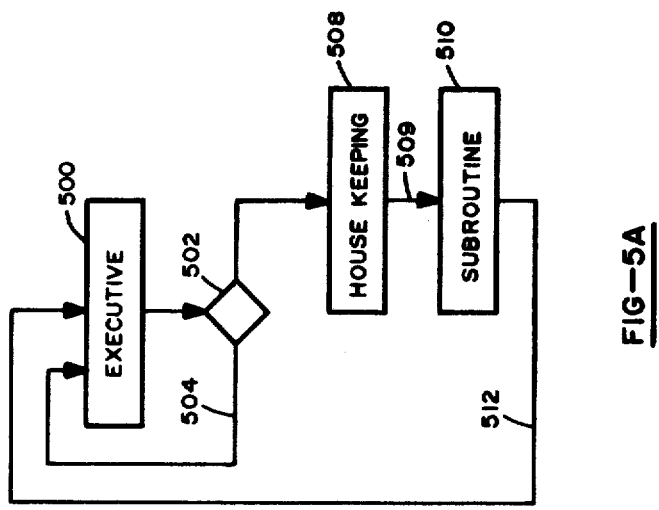
FIG—5A

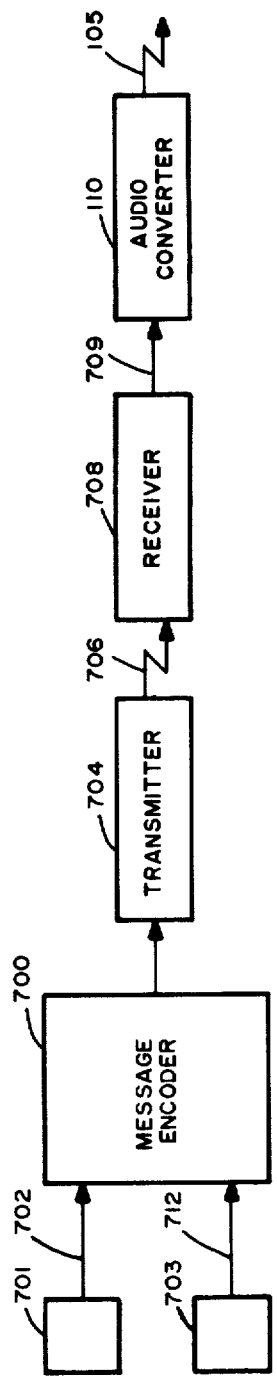
FIG—7

VOICE SIGNAL PROCESSING SYSTEM

CROSS REFERENCE TO RELATED APPLICATIONS

This application is a continuation-in-part of the chain of related patent applications (1) FACTORED DATA PROCESSING SYSTEM FOR DEDICATED APPLICATIONS S/N 101,881 filed on Dec. 28, 1970 by Gilbert P. Hyatt;

(2) CONTROL SYSTEM AND METHOD S/N 134,958 filed on Apr. 19, 1971 by Gilbert P. Hyatt;

(3) CONTROL APPARATUS S/N 135,040 filed on Apr. 19, 1971 by Gilbert P. Hyatt;

(4) COMPUTERIZED NUMERICAL CONTROL SYSTEM FOR PARTS PROGRAM CHECKOUT, EDITING, AND EXECUTION S/N 230,872 filed on Mar. 1, 1972 by Gilbert P. Hyatt;

(5) DATA PROCESSING SYSTEM HAVING A STORED PROGRAM COMPUTER DEDICATED TO THE NUMERICAL CONTROL OF A MACHINE S/N 232,459 filed on Mar. 7, 1972 by Gilbert P. Hyatt;

(6) APPARATUS AND METHOD FOR REAL TIME MACHINE CONTROL WITH A STORED PROGRAM DATA PROCESSOR S/N 246,867 filed on Apr. 24, 1972 by Gilbert P. Hyatt;

(7) COMPUTERIZED SYSTEM FOR OPERATOR INTERACTION S/N 288,247 filed on Sept. 11, 1972 by Gilbert P. Hyatt now U.S. Pat. No. 4,121,284 issued on Oct. 17, 1978;

(8) APPARATUS AND METHOD FOR PRODUCING HIGH REGISTRATION PHOTOMASKS S/N 229,213 filed on Apr. 13, 1972 by Gilbert P. Hyatt now U.S. Pat. No. 3,820,894 issued on June 28, 1974;

(9) STORED PROGRAM DATA PROCESSING SYSTEM FOR DIRECT CONTROL OF A MACHINE IN REAL TIME WITH DISCRETE SIGNALS S/N 291,394 filed on Sept. 22, 1972 by Gilbert P. Hyatt;

(10) DIGITAL ARRANGEMENT FOR PROCESSING SQUAREWAVE SIGNALS S/N 302,771 filed on Nov. 1, 1972 by Gilbert P. Hyatt;

(11) APPARATUS AND METHOD FOR PROVIDING INTERACTIVE AUDIO COMMUNICATION S/N 325,933 filed on Jan. 22, 1973 by Gilbert P. Hyatt now U.S. Pat. No. 4,016,540 issued on Apr. 5, 1977;

(12) ELECTRONIC CALCULATOR SYSTEM HAVING AUDIO MESSAGES FOR OPERATOR INTERACTION S/N 325,941 filed on Jan. 22, 1973 by Gilbert P. Hyatt now U.S. Pat. No. 4,060,848 issued on Nov. 29, 1977; and

(13) MEANS AND METHOD FOR COMPUTERIZED SOUND SYNTHESIS S/N 752,240 filed on Dec. 20, 1976 by Gilbert P. Hyatt; wherein the benefit of the filing dates of said chain of related applications are herein claimed in accordance with the United States Code such as with 35 USC 120 and 35 USC 121 and wherein the instant application is further related to but not a continuation-in-part of patent applications

(13) INTERACTIVE CONTROL SYSTEM S/N 101,449 filed on Dec. 28, 1970 by Lee, Cole, Hirsch, Hyatt, and Wimmer and now abandoned in favor of a continuing application; and

(14) ADAPTIVE ILLUMINATION SOURCE INTENSITY CONTROL DEVICE S/N 152,105 filed on June 11, 1971 by Lee, Wimmer, and Hyatt now U.S. Pat. No. 3,738,242 issued on June 12, 1973 and continuations and divisionals therefrom;

wherein these continuing and related patent applications are incorporated herein by reference as if fully set forth at length herein.

The relationship of the above referenced applications will become apparent to those skilled in the art from the disclosures therein and the disclosures herein and the wealth of prior art knowledge; wherein the above referenced applications are related to the system of the instant application and have substantial common disclosure with the instant application.

BACKGROUND OF THE INVENTION

1. Field of the Invention

This invention relates to audio reply and message systems for operator interaction.

2. Description of the Prior Art

Audio reply systems have taken the form of tape recorders, phonograph records, and other well known electromechanical devices. Speech is recorded on a medium such as a magnetic tape, then played back as required to provide the audio message.

Automatic playback devices are known in the prior art such as with telephone answering systems that answer with recorded instructions on a first magnetic tape, then record a telephone message on a second magnetic tape. These electro-mechanical systems are typically bulky, unreliable, and inflexible; which characteristics are inherent in electro-mechanical devices. Also, these prior art arrangements only provide sequential access for generating fixed messages and do not provide the capability for general message build-up. Therefore, multitudes of potential applications have not been feasible in the prior art due to the limitations of this equipment.

Electronic musical instruments such as electronic organs are known in the prior art. Although these instruments do not provide speech messages, they are exemplary of one type of prior art arrangement. These instruments provide for the selection of oscillators and filters, where the oscillators generate the desired tones and the filters shape and combine the waveforms to generate complex sounds. The oscillators and filters are analog devices, selected with operator switches and controls. These analog devices are limited in capability and do not easily lend themselves to monolithic processes.

The prior and subsequent art is further defined in the art-of-record of the related applications in the chain of continuing applications including U.S. Pat. No. 2,690,474 to Edgar; U.S. Pat. No. 2,897,638 to Maker; U.S. Pat. No. 3,012,724 to Williams; U.S. Pat. No. 3,088,661 to Brigham; U.S. Pat. No. 3,102,165 to Clapper; U.S. Pat. No. 3,142,820 to Daniels; U.S. Pat. No. 3,215,987 to Terzian; U.S. Pat. No. 3,209,074 to French; U.S. Pat. No. 3,248,708 to Haynes; U.S. Pat. No. 3,253,263 to Lee; U.S. Pat. No. 3,281,789 to Willcox; U.S. Pat. No. 3,297,107 to Shipp; U.S. Pat. No. 3,332,071 to Goldman; U.S. Pat. No. 3,344,239 to Ragland; U.S. Pat. No. 3,346,853 to Koster; U.S. Pat. No. 3,356,836 to Stenby; U.S. Pat. No. 3,380,025 to Ragland; U.S. Pat. No. 3,389,404 to Koster; U.S. Pat. No. 3,398,241 to Lee; U.S. Pat. No. 3,403,227 to Malm; U.S. Pat. No. 3,440,618 to Chinlund; U.S. Pat. No. 3,462,743 to Miller; U.S. Pat. No. 3,471,644 to Gold; U.S. Pat. No. 3,506,975 to Bobeck; U.S. Pat. No. 3,533,078 to Perkins;

U.S. Pat. No. 3,560,933 to Schwartz; U.S. Pat. No. 3,566,365 to Rawson; U.S. Pat. No. 3,566,370 to Worthington; U.S. Pat. No. 3,576,433 to Lee; U.S. Pat. No. 3,577,201 to Langley; U.S. Pat. No. 3,578,912 to Beavers; U.S. Pat. No. 3,581,014 to Vogel; U.S. Pat. No. 3,584,781 to Edison; U.S. Pat. No. 3,584,782 to Bergland; U.S. Pat. No. 3,587,085 to Baxter; U.S. Pat. No. 3,588,353 to Martin; U.S. Pat. No. 3,588,838 to Felcheck; U.S. Pat. No. 3,593,313 to Tomaszewski; U.S. Pat. No. 3,602,901 to Dixton Teh-Chao Jen; U.S. Pat. No. 3,611,347 to Gingell; U.S. Pat. No. 3,619,590 to Barger; U.S. Pat. No. 3,631,403 to Asbro; U.S. Pat. No. 3,631,408 to Kubo; U.S. Pat. No. 3,634,883 to Kreidermacher; U.S. Pat. No. 3,639,691 to Benninghof; U.S. Pat. No. 3,641,329 to De Sandro; U.S. Pat. No. 3,641,496 to Slavin; U.S. Pat. No. 3,641,558 to Cook; U.S. Pat. No. 3,646,522 to Furman; U.S. Pat. No. 3,653,001 to Ninke; U.S. Pat. No. 3,654,708 to Brudner; U.S. Pat. No. 3,659,275 to Marshall; U.S. Pat. No. 3,673,576 to Donaldson; U.S. Pat. No. 3,676,656 to Schmidt; U.S. Pat. No. 3,679,875 to Rawson; U.S. Pat. No. 3,681,756 to Burkhard; U.S. Pat. No. 3,681,757 to Allen; U.S. Pat. No. 3,686,637 to Zachar; U.S. Pat. No. 3,688,271 to Rouse; U.S. Pat. No. 3,702,988 to Haney; U.S. Pat. No. 3,703,609 to Gluth; U.S. Pat. No. 3,704,345 to Coker; U.S. Pat. No. 3,723,655 to Zucker; U.S. Pat. No. 3,727,190 to Vogelman; U.S. Pat. No. 3,728,710 to Berg; U.S. Pat. No. 3,737,863 to Rowland; U.S. Pat. No. 3,740,725 to Fletcher; U.S. Pat. No. 3,744,030 to Kuljian; U.S. Pat. No. 3,747,069 to Hershberg; U.S. Pat. No. 3,748,452 to Ruben; U.S. Pat. No. 3,757,308 to Fosdick; U.S. Pat. No. 3,760,171 to Wang; U.S. Pat. No. 3,775,752 to Lorenzo; U.S. Pat. No. 3,775,756 to Balser; U.S. Pat. No. 3,778,774 to Phillips; U.S. Pat. No. 3,810,106 to Nadler; U.S. Pat. No. 3,820,071 to Angus; U.S. Pat. No. 3,828,132 to Flanagan; U.S. Pat. No. 3,836,717 to Gagnon; U.S. Pat. No. 3,870,818 to Barton; U.S. Pat. No. 3,878,514 to Faber; and U.S. Pat. No. 3,892,919 to Ichikawa and including the articles Computer Controlled Audio Output by Buchholz in the IBM Technical Disclosure Bulletin vol. 3 No. 5 dated Oct. 1960 at page 60; Speech Digitizer and Synthesizer by Bandat in the IBM Technical Disclosure Bulletin vol. 7 No. 11 dated Apr. 1965 at pages 974 and 975; Dersch in the IBM Technical Disclosure Bulletin vol. 5 No. 5 dated Oct. 1962; Electronic Navigator Charts Man's Path To The Moon by Hopkins in Electronics Magazine dated January 9, 1967 at pages 109–118; System Utilization Of Large-Scale Integration by Levy et al. in the IEEE Transactions On Computers dated October 1967 at pages 562–566; System Architecture For Large Scale Integration by Beelitz et al. in the AFIPS Conference Proceedings dated Nov. 1967 at pages 185–200; Adder On A Chip! LSI Helps Reduce Cost Of Small Machine by Boysel in Electronics Magazine dated March 18, 1968 at pages 119–124; Microprogrammable Digital Computer by Micro Systems, Inc. in Computer Design Magazine dated May 1969 at page 69; and Handbook by Microdata QA76.6 M5, C.2; which references are all incorporated herein by reference as constituting pertinent prior and subsequent art.

An object of this invention is to provide a practical audionic system.

A further object of this invention is to provide an audionic calculator system.

A further object of this invention is to provide an audionic clock system.

A further object of this invention is to provide a concentrated speech communication system.

Still another object of this invention is to provide an audionic medical testor.

The foregoing and other objects, features, and advantages of this invention will be apparent from the following detailed description of preferred embodiments of this invention, as illustrated in the accompanying drawings.

BRIEF DESCRIPTIONS OF THE DRAWINGS

A better understanding of the invention may be had from a consideration of the following detailed description taken in conjunction with the following drawings, in which:

FIG. 1 is a block diagram of the system comprising FIG. 1A showing a general purpose data processing system having audio response capability and FIG. 1B showing the audio response portion of the system of FIG. 1A.

FIG. 4 illustrates audionic signals comprising FIG. 4A showing a first waveform to exemplify audio signal buildup and FIG. 4B showing a second waveform to exemplify superposition of waveforms.

FIG. 7 is a block diagram of an audionic communication link. de

Figure 2:
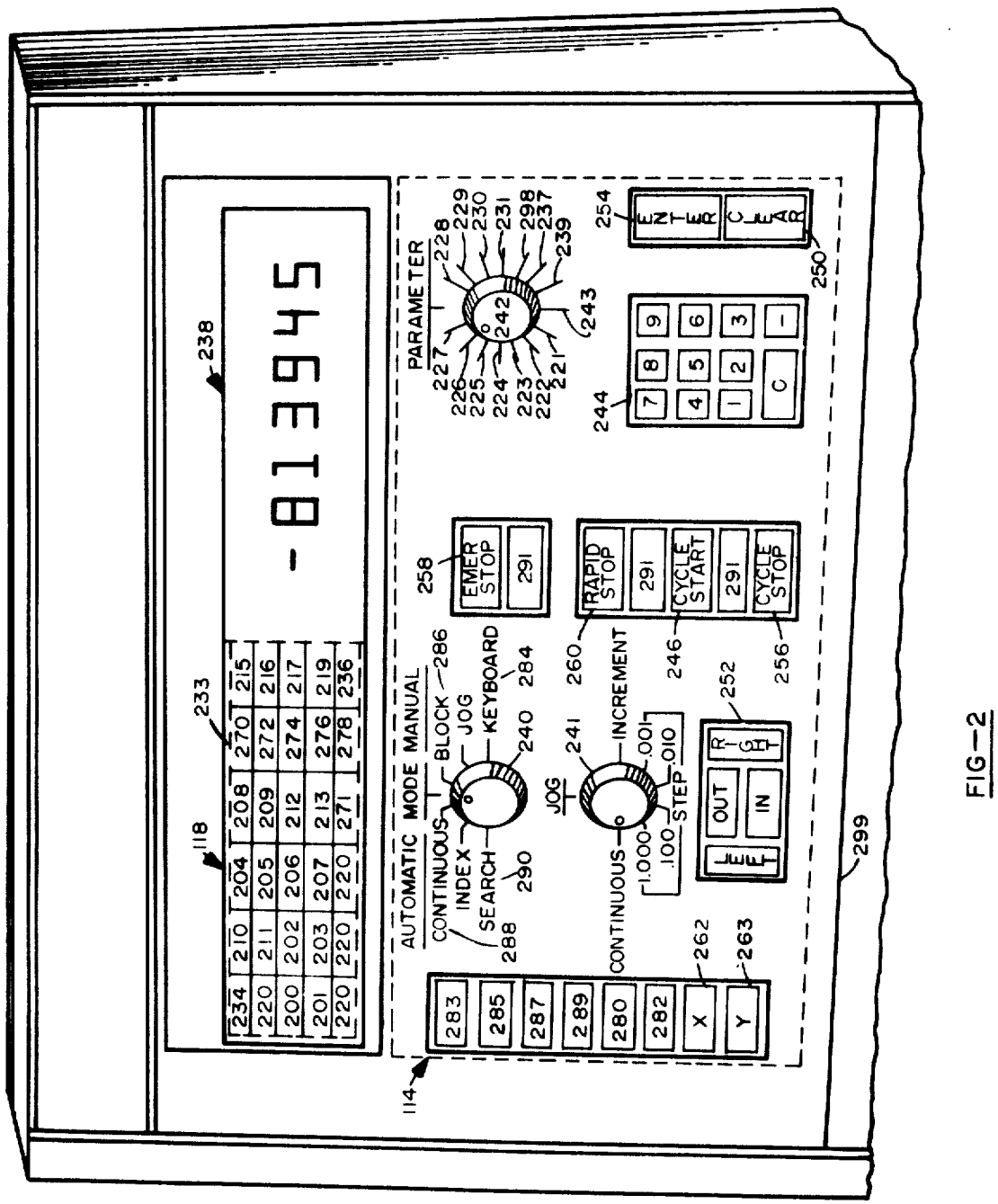
FIG. 2 is a diagram of the control and display panel.

FIGS. 1A and 2 of this application are generally the same as FIGS. 1 and 2 in the previously referenced applications, Computerized System For Operator Interaction S/N 288,247 and Factored Data Processing System For Dedicated Applications S/N 101,881; with changes to make those figures compatible with the form and substance of the instant application.

By way of introduction of the illustrated embodiment, the components shown in FIGS. 1 through 7 of the drawings have been assigned general reference numerals and a brief description of such components is given in the following description. The components in each figure have in general been assigned three digit reference numerals wherein the hundreds digit of the reference numerals corresponds to the figure number. For example, the components in FIGS. 1A and 1B have reference numerals between 100 and 19.9 and the components in FIG. 2 have reference numerals between 200 and 299 except that the same component appearing in successive drawing figures has maintained the first reference numeral.

DETAILED DESCRIPTION OF THE INVENTION

The audionic system of this invention can take any of a number of possible forms. A preferred embodiment of the present invention is shown in FIGS. 1A and 1B and will be described in detail hereafter.

This application is a continuation-in-part of the previously referenced applications S/N 101,881 and S/N 288,247 and relates more specifically to an audionic message system which may be provided by applying the general teachings of the parent applications to the specific context of this audionic system for operator interaction.

The system of this invention is exemplified by the system disclosed in the referenced copending applications and shown in FIG. 1A. As discussed in the parent applications, the system peripherals and extremities may be changed to meet the requirements of the particular application while still exemplifying the teachings of that invention. For example, the data processing system 110 has been shown as a numerical control system for controlling a milling machine 124, where input and output peripheral subsystems have been described which are suitable for performing this desired control function in the previously referenced application S/N 101, 881. However, those skilled in the art will readily recognize that the numerical control system is merely illustrative of the present invention and the principles of that invention are equally applicable to other systems such as audionic systems described herein in which different forms of input and output peripheral subsystems might be used to perform the particular task of such other systems. An audionic subsystem is shown in FIG. 1B to illustrate the audionic application of the system of this invention.

In the preferred embodiment, the system of this invention is a dedicated data processing system; where the data processor 112 is a stored program data processor committed to one or more prime tasks. As shown in FIGS. 1A and 1B, the data processor 112 performs a system prime task under program control such as the numerical control of a machine 124 or such as calculator processing in conjunction with an operator through control panel 114 and display panel 118. In the system of this invention, an audionic subsystem 100 including audionic interface 102 and transducer 104 is provided for operator communication, where the peripherals not required for this audionic system such as the machine 124 of the numerical control application are not included in the system.

The data processor 112 may also perform system subtasks such as processor coaction for operation of a peripheral as discussed for the factored or integrated data processing system of the parent applications and as discussed for the analog-to-digital (A/D) converter hereafter.

It is within the scope of this invention to provide a display panel 118 as an auxiliary operator interface in the audionic system and may be refreshed such as under computer program control as described in detail in the referenced applications. It is still further within the scope of this invention to provide computer processing of switch rudimentary signals as discussed in the referenced applications.

The data processor 112 operates under control of a program stored in the main memory 130 and may operate in conjunction with a scratch pad memory 131. As discussed in the parent applications, the preferred embodiment of this data processor is as a monolithic data processor, where the main memory 130 is an integrated circuit read only memory and the scratch pad or intermediate memory 131 is an integrated circuit alterable memory.

Figure 3:
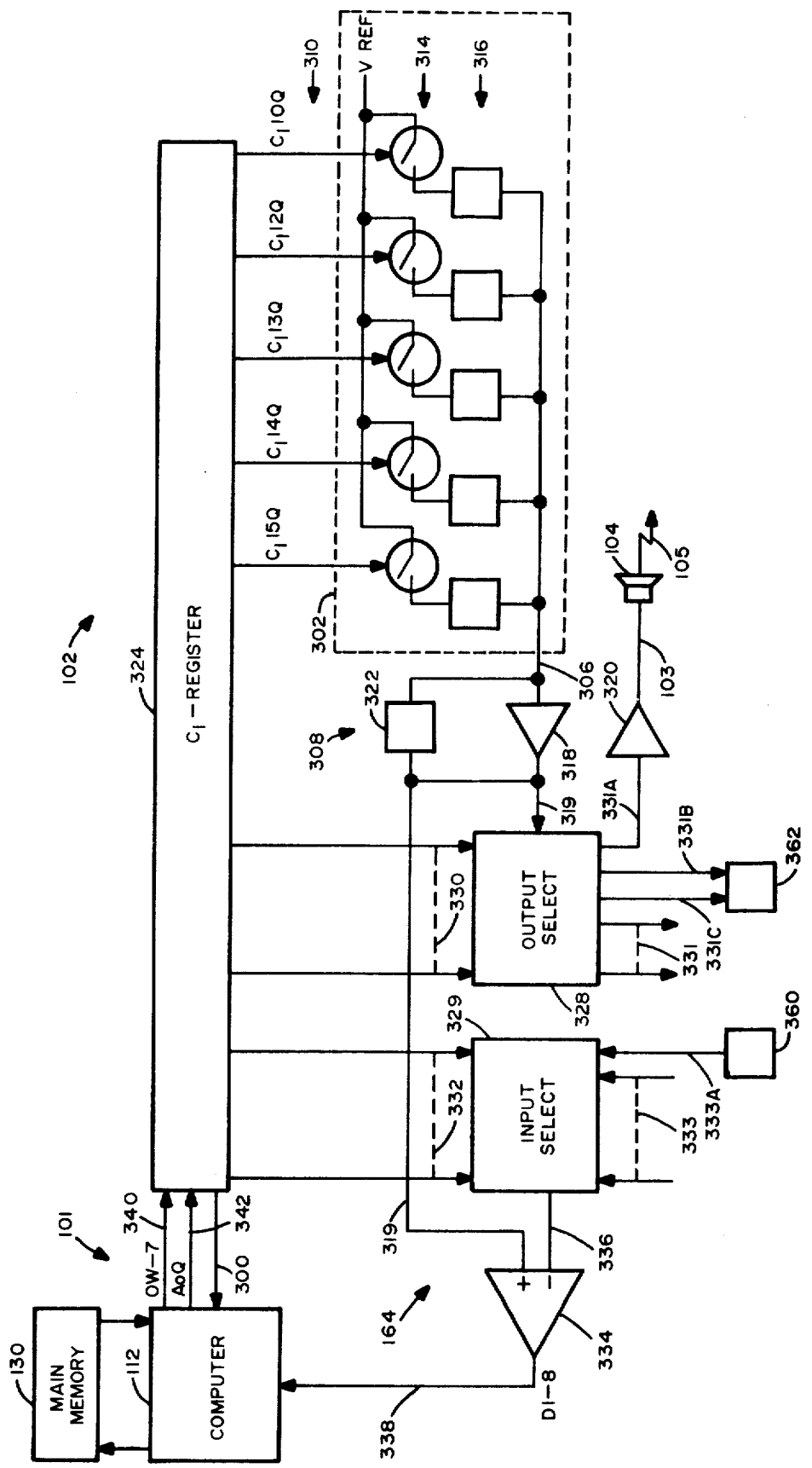
FIG. 3 is a block diagram and schematic diagram of the converter subsystem.
Figure 6:
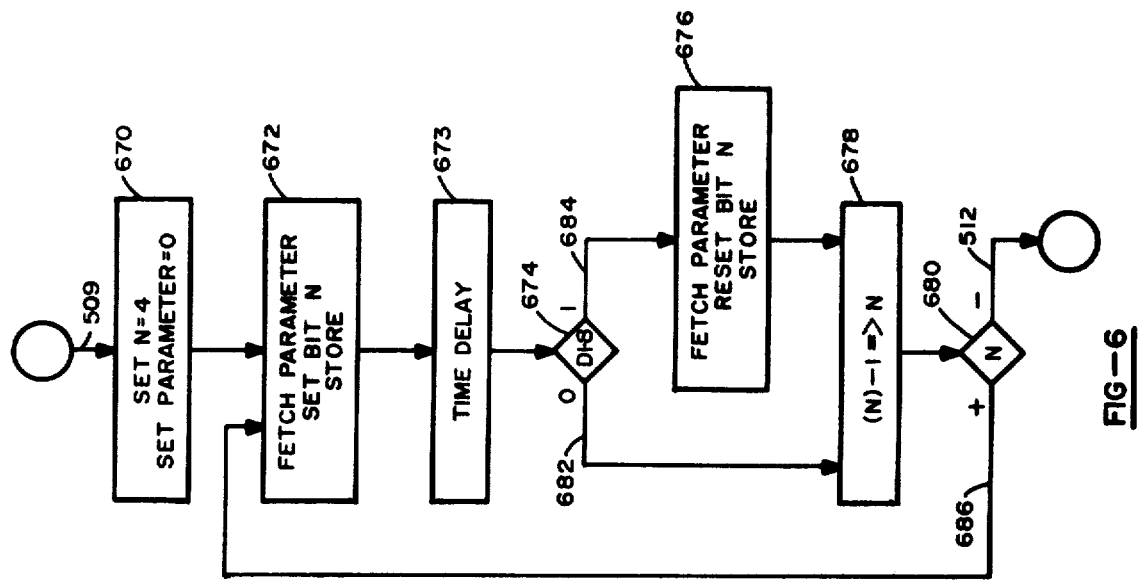
FIG. 6 shows a program flow diagram of converter operations.
Figure 5D:
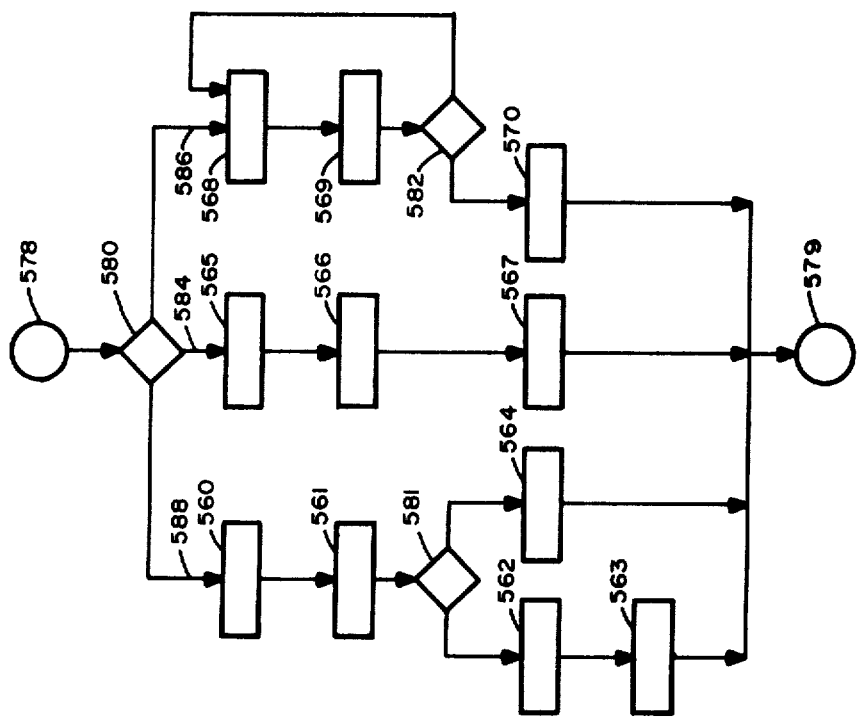
FIG. 5 shows program flow diagrams of audionic operations comprising FIG. 5A showing an executive routine, FIG. 5B showing a flow diagram related to generating the waveform of FIG. 4A, FIG. 5C showing a flow diagram related to generating the waveforms of FIG. 4B, and FIG. 5D showing a flow diagram related to signal buildup.

The data processor 112 operates in conjunction with a plurality of peripherals which include an audionic subsystem which is shown in FIGS. 1B and 3 which may include an operator panel such as the control panel 114 or display panel 118 or both, which are shown in more detail in FIG. 2; a tape reader 116 which may be a punched tape reader; a data link 150 to communicate with a computer center 160 and other systems 162; an auxiliary memory 152 such as a rotating memory or other well known memory; line drivers and receivers 154 to communicate with various other subsystems; a typewriter 156; a CRT display and light pen 158; and other such subsystems.

A reduced block diagram is shown in FIG. 1B where the system of FIG. 1A is reduced to the specific form of an audionic system. Processor 112 is responsive to information stored in memory 130 to provide audionic messages 101 to audionic interface 102 to control transducer 104 with signals 103. The transducer provides audio (sound) signals 105 in response to electrical control signals 103. The data processor 112 is a stored program data processor in a preferred embodiment but may be a special purpose logic device in other embodiments. The interface 102 accepts digital command signals 101 and generates transducer control signals 103. In a preferred embodiment, audionic interface 102 includes a D/A converter and amplifier to drive transducer 104 with analog control signals 103. A preferred embodiment of a D/A converter 302 is discussed in detail hereafter. Other embodiments will become obvious to those skilled in the art. In other embodiments, audionic interface 102 can be implemented with other control arrangements, where control signals 103 may be digital drive signals or other such signals. It will become obvious to those skilled in the art that other control or signal processing arrangements can be provided for interface 102 that will be responsive to digital command signals to provide the speech messages.

The audionic transducer 104 may be a well known speaker or earphone for generating sound waves in an air medium or may be another type of transducer that impresses audionic signals on other medium such as in water or on a bone. Therefore, audionic signals may include sound waves, speech waves, vibration, and other such signals. Various input subsystems 106 and output subsystems 108 may also be included in the audionic system as required by the application.

As shown in FIG. 3, a parallel output register 324 receives digital signals 101 from data processor 112 to excite D/A converter 302. Register 324 is exemplified by the $C_I$ Register shown in FIGS. 13 and 15 of the referenced application S/N 101,881. The digital signals $C_{I15}Q$ through $C_{I10}Q$ select analog switches 314, which may be FET switches or other well known circuits, to selectively excite the resistor ladder 316 to sum the signals from switches 314 to generate analog signal 306.

Amplifier 318 and power amplifier 320 will buffer, filter, and amplify analog signal 306 to generate signal 103 to drive the sound transducer 104. Other circuit arrangements will become obvious to those skilled in the art.

Operation of the audionic device is generally described with a constant sample rate or a constant period between sample updates. An added degree of flexibility and optimization is achieved with a variable sample rate or update period. As will be discussed hereafter in conjunction with the waveform of FIG. 4A and the program flow chart of FIG. 5B, a programmable period T is provided to decrease the required number of samples, to increase audio fidelity, and to generally increase the flexibility of the audionic system.

The operation of this invention will be better understood with a simple example. A repetitive square wave waveform is illustrated in FIG. 4A. This waveform is characterized by amplitudes $A_1$ 400, $A_2$ 402, and $A_3$ 404 with corresponding periods $T_1$, $T_2$, and $T_3$. If this waveform were properly amplified and used to excite a speaker transducer, a characteristic sound would be generated.

A preferred embodiment of the apparatus to generate this sound is shown in FIG. 3. The digital data processor 112 accesses digital sound information from a digital audionic memory such as the main memory 130 of the data processor 112 or an auxiliary memory 152. The digital memory may be a core memory, an integrated circuit read only memory, a rotating memory such as a drum or disc, or other such memory. In a preferred embodiment, an integrated circuit read only memory is used. The digital signals 101 are transferred to a D/A converter 302 which converts the digital signals 101 to analog sound signals 306. These analog sound signals 306 are processed with an audio signal processor 308 which may include amplifiers 318, 320; filters 322; and other audio signal processor devices. The processed analog sound signals 103 are used to drive a sound transducer 104 to generate audiable sound 105. This sound must be of the proper amplitude and frequency to be detected in a useful form at the destination, which is typically the human ear.

An audionic system can provide a plurality of time shared outputs. As shown in FIG. 3, the computer 112 can sequentially select a plurality of output channels 331 with addresses 330 to select logic 328. Each output channel 331 can be an audionic channel as illustrated for channel 331A with amplifier 320 and transducer 104, where amplifier 320 can provide a sample-and-hold capability to enhance time share operation. This multiple output system can be used for a system having a plurality of operators such as an airplane with a flight crew, an audionic testor for a plurality of patients being tested, or other such applications.

A further detailed description of the invention is provided in referenced application S/N 325,941 at pages 15–21 therein; which is now U.S. Pat. No. 4,016,540 at column 8 line 35 to column 12 line 3 therein; and which is herein incorporated by reference.

FURTHER DISCUSSIONS

Discussions on Audionic Program Operations, Audionic Program Generation, Elemental Converter, Operation, Applications, Audionic Calculator, Audionic Clock, Audionic Typewriter, Audionic Cash Register, Multi-Terminal System, Vehicular Announciator, Audionic Medical testor, Audionic Data Concentrator, Audionic Musical Instruments, and Audionic Monitor are provided in referenced application S/N 325,941 at pages 22 to 70 therein; which is now U.S. Pat. No. 4,016,540 at column 16 line 6 to column 35 line 35 therein; and which is herein incorporated by reference.

SCOPE AND DEFINITIONS

The invention disclosed herein is presented in a preferred embodiment of a digital audionic system to exemplify the inventive features, but the scope of this invention is much broader than illustrated with the preferred embodiment. This scope is intended to be broadly interpreted to cover the general fields of interaction between an operator and a machine or other device.

The audionic system described herein can be used in a wide range of applications, where an audionic calculator and an audionic clock are typical of these applications. Other applications include a typewriter, medical testor, data concentrator, musical instruments, monitor, vehicular announciator, cash register, appliance, and others described herein. The broad scope of this audionic invention permits it to be used in virtually every system involved in communicating with an operator or where operator feedback would enhance utilization. Therefore, the applications described herein are in no way intended to place a limitation on the broad applicability of this invention. For example, the use of the features of the present invention in well known products such as toys, games, and other consumer products will become obvious to one skilled in the art from the teachings herein and from products that are well known in the art.

In order to describe the features of this invention, simplified block diagrams and schematic diagrams are used having symbolic representations. As an example, digital logic is shown using symbols associated with digital integrated circuits such as the Texas Instruments series 7400 integrated circuits. As another example, analog switches are shown symbolically in FIG. 3 which may be implemented with FET switches or other analog switches. The detailed circuit arrangements to implement the symbolic representations will become obvious to those skilled in the art.

Various publications may be used for providing background for this invention and for illustrating the prior art. The various subject areas and associated references for each subject area are listed below.

(1) Pattern recognition is described in the book *Computer-Oriented Approaches to Pattern Recognition* by William S. Meisel for Academic Press (1972).

(2) Integrated circuit technology is described in the book *Integrated Circuits* by Raymond M. Warner, Jr. and James N. Fordemwalt (Editors) for McGraw-Hill Book Compary (1965).

(3) Digital computer technology is described in the books
  (a) *Digital Computer Design* by Edward L. Braun for Academic Press (1963) and
  (b) *Digital Computer Design Fundamentals* by Yaohan Chu for McGraw Hill (1962).

(4) Digital computer programming is described in the books
  (a) *Programming: An Introduction to Computer Languages and Techniques* by Ward Douglas Maurer for Holden Day Inc. (1968),
  (b) *Programming for Digital Computers* by Joachim Jeenel for McGraw Hill (1959),
  (c) *Elements of Computer Programming* by Swallow and Price for Holt, Rinehart, and Winston (1965),
  (d) *Programming and Coding Digital Computers* by Philip M. Sherman for John Wiley & Sons Inc. (1963),
  (e) *Digital Computer Programming* by Peter A. Start for MacMillian Co. (1967),
  (f) *IBM 360 Programming and Computing* by Golden and Leichus for Prentis-Hall Inc. (1967),
  (g) *Fundamentals of Flowcharting* by Thomas J. Schriber for John Wiley & Sons, Inc. (1969), and
  (h) *Design of Real-Time Computer Systems* by James Martin.

(5) Audio technology is described in the books (a) *Speech Analysis, Synthesis, and Perception* (Second Edition) by J. L. Flanagan for Springer-Verlag (1972); particularly in Chapter VI (P. 204–275) on Speech Synthesis and Chapter VIII (P. 321–405) on Systems for Analysis-Synthesis Telephony and (b) *Manual of Phonetics* by Bertil Malmberg (Editor) for North-Holland Publishing Co. in Amsterdam (1968); particularly in Chapter 8 (P. 173–277) on Analysis and Synthesis of Speech Processes. These publications and the publications referenced therein are incorporated herein by reference.

Terminology used in this description will now be defined to more clearly illustrate the intended meaning.

The term "word" is intended to mean a generalized parameter comprising a plurality of digital bits or other conditions and may relate to letters, numbers, combinations of letters and numbers, or other such groups of conditions.

The computer system of the referenced application S/N 101,881 exemplifies a system that can be used to implement this invention. The data processor and input/output structure of that parent application are used to illustrate one form of this invention.

The terms computer and data processor are each intended to mean an arrangement for processing signals. In a preferred embodiment, the computer or data processor is a stored program digital computer or stored program digital data processor as exemplified in the parent applications.

The term computer as used in the description of a preferred embodiment herein is intended to mean a stored program digital data processor. This includes the well known prior art general purpose digital computers such as mini-computers, but also includes the monolithic data processor and factored data processor disclosed in the referenced application S/N 101,881, and the extension of these data processor concepts to higher levels of integration; where the computer may be distributed throughout the system and may be physically and operationally associated with an extremity of the system, or the computer may be merged to such a degree that the component computer parts are individually indistinguishable.

A dedicated computer system may be dedicated to one or more tasks which may include a prime task such as numerical control, payroll processing, or calculator processing and one or more sub-tasks such as controlling extremities. Also, the data processor need not maintain it's physical or operational identity. Also, this invention is not limited to a single computer but may include a plurality of computers associated with various portions of the prime task and sub-tasks.

A data processing system can be structured with (1) extremities that may have a physical size and form and (2) monolithic data processors that may have relative inconsequential size and form; where the data processors can be totally distributed to the extremity for performance of the functions of the extremity under program control and may be dedicated to one or more extremities. In this case, a plurality of data processors may be distributed throughout the system, each dedicated to a data processor prime task, which may be a system prime task or sub-task.

The term hybrid is herein intended to pertain to both, analog and digital, signal processing. In particular, the analog-to-digital and digital-to-analog converters described herein are hybrid arrangements.

The audionic device described herein is described in relation to an audio speech reply system which exemplifies the general principles of this invention. It will become obvious to those skilled in the art that the audionic device is not limited to speech replies, but is generally applicable to any audio signals. For example, the sense of hearing can be stimulated by transducers mounted on a sensitive portion of an operator such as a bone in proximity with an ear as with hearing aid type devices. This type of signal transmission and other forms of signal transmission are intended to be included within the broad scope of this invention. Also, the principles disclosed herein are widely applicable to the general construction of signals by electronic means and not limited to audio signals. This invention is therefore intended to be interpreted in broad form to cover general signal construction such as light, sound, electronic signals, and others that will become obvious to those skilled in the art.

An audionic device is herein intended to mean a device for digitally generating audio messages and replies. The operator may be located in close proximity with the audionic device or may be located remotely such as with receiving the audio reply over a telephone link.

A monolithic audionic system is intended to mean an audionic system comprising an integrated circuit or monolithic computer including an integrated circuit audionic memory for storage of audionic information.

The use of audionic message sub-systems may improve the performance of systems with which the audionic sub-system is associated. Various systems described herein use the digital audionic device of this invention. It will become obvious that these systems may also provide some advantages with the use of mechanical and analog filter arrangements. Therefore, the claimed inventive features relating to application of audionic systems are intended to be generally interpreted in broad terms to cover the use of all forms of audio devices that can provide the audio capability described herein. The digital audionic arrangement of this invention provides a preferred embodiment of such an audio message arrangement.

As used in this application, a stored program computer is said to be operating on a real time basis when time of occurance of the computer operations in a data processing subsystem is dictated by the requirements of a peripheral subsystem or external devices rather than by computer operations.

It is thus clearly seen that the present invention provides a novel means and method of providing a data processor system for operator interaction through audionic messages.

From the above description it will be apparent that there is thus provided a device of the character described possessing the particular features of advantage before enumerated as desireable, but which obviously is susceptible to modification in it's form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. A sound signal processing system comprising:
   input means for generating an input signal in response to an input sound and
   Fourier processor means for generating a frequency word related to the input sound in response to the input signal.

2. The system as set forth in claim 1 above, further comprising:
   sample means for generating a plurality of input samples in response to the input signal and
   memory means for storing the plurality of input samples; wherein said Fourier processor means generates the frequency word in response to the input signal responsive input samples.

3. The system as set forth in claim 1 above, further comprising:
   converter means for generating a plurality of digital samples in response to the input signal and
   memory means for storing the plurality of digital samples; wherein said Fourier processor means is responsive to the stored digital samples for generating the frequency word.

4. The system as set forth in claim 1 above, further comprising means for generating an output sound in response to the frequency word.

5. A sound signal processing system comprising:
   transducer means for generating a transducer signal in response to a sound;
   converter means for generating a plurality of digital sample words in response to the transducer signal;
   memory means for storing the plurality of digital sample words;
   data processor means for generating at least one frequency-related digital word in response to the stored digital sample words; and
   output means for generating an output digital word in response to the frequency-related digital word, wherein said output digital word identifies the sound.

6. The system as set forth in claim 5 above, further comprising sound generating means for generating a sound in response to the output digital word.

7. The system as set forth in claim 5 above, further comprising output means for performing an output task in response to the output digital word.

8. The system as set forth in claim 5, above further comprising:
   communication means for communicating the output digital word to a remote location and
   means for generating a sound at the remote location in response to the communicated output digital word.

9. The system as set forth in claim 4 above further comprising output means for generating an output sound in response to the frequency word generated with said Fourier processor means.

10. The system as set forth in claim 9 above, wherein said input means includes a microphone for generating the input signal in response to the input sound and wherein said output means includes circuit means for generating an output signal in response to the frequency word and a speaker for generating the output sound in response to an output signal.

11. The system as set forth in claim 1 above, further comprising means for controlling a machine in response to the frequency word generated with said Fourier processor means.

12. The system as set forth in claim 1 above, wherein said Fourier processor means includes:
   an integrated circuit read only memory for storing a computer program;
   an integrated circuit alterable memory for storing processed information; and
   processing means for processing the information stored in said alterable memory in response to the computer program stored in said read only memory to generate the frequency word in response to the input signal.

13. The system as set forth in claim 1 above, further comprising a display for displaying information to an operator in response to the frequency word generated with said Fourier processor means.

14. The system as set forth in claim 1 above, further comprising output means for generating an output word in response to the frequency word and a data link for communicating the output word to a remote location.

15. The system as set forth in claim 14 above, further comprising a remote system location at the remote location for generating a sound in response to the communicated output word from said data link.

16. The system as set forth in claim 1 above, further comprising:
   output means for generating an output signal in response to the frequency word and
   a typewriter for generating a typed message in response to the output word.

17. The system as set forth in claim 1 above, further comprising:
   output means for generating an output word in response to the frequency word and
   a CRT for displaying information in response to the ouput word.

18. The system as set forth in claim 1 above, further comprising:
   output means for generating an output word in response to the frequency word and
   a machine control for controlling a machine in response to the output word.

19. The system as set forth in claim 5 above, wherein said data processor means is arranged as a stored program computer for processing digital information under program control, said stored program computer including:
   an integrated circuit read only memory for storing the program;
   an integrated circuit alterable memory for storing processed information; and
   computer logic for processing the information stored in said alterable memory to generate the frequency related digital word in response to the stored digital sample words under control of the program stored in said read only memory.

20. The system as set forth in claim 5 above, further comprising a display for displaying information to an operator in response to the output digital word.

21. The system as set forth in claim 5 above, further comprising communication means for communicating information to a remote location in response to the output digital word.

22. The system as set forth in claim 21 above, further comprising a sound generator locate at said remote location for generating a sound in response to the communicated information.

23. The system as set forth in claim 5 above, further comprising a typewriter for generating a typed message in response to the output digital word.

24. The system as set forth in claim 5 above, further comprising a CRT for generating a CRT display in response to the output digital word.

25. The system as set forth in claim 5 above, further comprising a machine control for controlling a machine in response to the output digital word.

* * * * *